(12) United States Patent
Gonzalez et al.

(10) Patent No.: US 12,196,784 B1
(45) Date of Patent: Jan. 14, 2025

(54) MAGNETOSTRICTIVE CURRENT SENSOR METHOD AND SYSTEM

(71) Applicant: National Technology & Engineering Solutions of Sandia, LLC, Albuquerque, NM (US)

(72) Inventors: Sigifredo Gonzalez, Albuquerque, NM (US); Jack David Flicker, Albuquerque, NM (US); Todd Monson, Albuquerque, NM (US); Eric Langlois, Auburn, NH (US); Nicholas Sonny Gurule, Albuquerque, NM (US); Olga Lavrova, Las Cruces, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 17/577,453

(22) Filed: Jan. 18, 2022

(51) Int. Cl.
*G01R 15/14* (2006.01)
*G01R 31/52* (2020.01)
*G01R 31/56* (2020.01)

(52) U.S. Cl.
CPC ........... *G01R 15/148* (2013.01); *G01R 31/52* (2020.01); *G01R 31/56* (2020.01)

(58) Field of Classification Search
CPC . G01R 31/50–54; G01R 31/58; G01R 15/148
See application file for complete search history.

(56) References Cited

U.S. PATENT DOCUMENTS

| | | | | |
|---|---|---|---|---|
| 5,083,087 A * | 1/1992 | Fox | ......... | G01R 31/54 324/555 |
| 5,297,439 A * | 3/1994 | Tyren | ......... | G01L 3/102 73/779 |
| 6,727,692 B2 * | 4/2004 | Ciureanu | ......... | G01R 33/02 324/249 |
| 6,815,948 B1 * | 11/2004 | Kwun | ......... | G01N 27/82 324/238 |
| 9,329,244 B2 * | 5/2016 | Maier | ......... | G01R 33/096 |
| 9,983,234 B2 * | 5/2018 | Knowles | ......... | G01L 1/2206 |
| 10,132,699 B1 | 11/2018 | Pillars et al. | | |
| 10,260,969 B1 | 4/2019 | Pillars et al. | | |
| 10,510,945 B1 * | 12/2019 | Langlois | ......... | C25D 5/619 |
| 10,585,127 B2 * | 3/2020 | Gabrielsson | ......... | G01R 15/185 |
| 2001/0017541 A1 * | 8/2001 | Kwun | ......... | G01N 29/2412 324/240 |
| 2001/0019263 A1 * | 9/2001 | Kwun | ......... | G01N 29/11 324/217 |
| 2004/0156153 A1 * | 8/2004 | Csanky | ......... | G01R 31/1272 361/42 |

(Continued)

*Primary Examiner* — Lee E Rodak
*Assistant Examiner* — Demetrius R Pretlow
(74) *Attorney, Agent, or Firm* — Daniel J. Jenkins

(57) ABSTRACT

A method and system for determining the state of one or both of an electrical conductor or an associated system utilizing a non-invasive sensor and a magnetostrictive response from the current of the electrical conductor. The method includes providing a sensor assembly including a magnetostrictive resonator sensor and a signal detector. A state of one or both of the electrical conductor or the associated system is determined with the fault detector in response to a first frequency profile and a second frequency profile obtained with the magnetostrictive resonator sensor. A fault monitoring system utilizing a magnetostrictive resonator sensor is also disclosed.

19 Claims, 12 Drawing Sheets

(56) References Cited

U.S. PATENT DOCUMENTS

| | | | | |
|---|---|---|---|---|
| 2004/0251910 | A1* | 12/2004 | Smith | G01R 31/14 |
| | | | | 324/510 |
| 2006/0145692 | A1* | 7/2006 | Kim | B06B 1/08 |
| | | | | 324/228 |
| 2007/0107528 | A1* | 5/2007 | Schroeder | G01B 7/24 |
| | | | | 73/779 |
| 2008/0042636 | A1* | 2/2008 | Koste | G01R 15/205 |
| | | | | 324/96 |
| 2008/0276111 | A1* | 11/2008 | Jacoby | G06F 11/3062 |
| | | | | 713/340 |
| 2009/0072822 | A1* | 3/2009 | Sun | G01N 27/9046 |
| | | | | 29/605 |
| 2009/0107247 | A1* | 4/2009 | Schroeder | G01L 9/007 |
| | | | | 73/779 |
| 2014/0049008 | A1* | 2/2014 | Ziegler | G01M 3/183 |
| | | | | 277/320 |
| 2014/0132256 | A1* | 5/2014 | Law | G01R 33/0327 |
| | | | | 324/244.1 |
| 2014/0168843 | A1* | 6/2014 | Privitera | G01R 31/50 |
| | | | | 702/58 |
| 2016/0041025 | A1* | 2/2016 | Haynes | G01F 23/72 |
| | | | | 73/1.73 |
| 2017/0074906 | A1* | 3/2017 | Knowles | G01R 15/18 |
| 2019/0377021 | A1* | 12/2019 | Bhalwankar | G01R 15/202 |
| 2020/0182921 | A1* | 6/2020 | Jakupi | H02H 1/0007 |
| 2020/0225066 | A1* | 7/2020 | Diatzikis | G01B 9/02 |
| 2021/0066904 | A1* | 3/2021 | Ionescu | H02H 1/0015 |
| 2022/0349920 | A1* | 11/2022 | Loyau | G01R 15/20 |

\* cited by examiner

MAGNETOSTRICTIVE CURRENT SENSOR METHOD AND SYSTEM

GOVERNMENT INTEREST STATEMENT

This invention was made with Government support under Contract No. DE-NA0003525 awarded by the United States Department of Energy/National Nuclear Security Administration. The U.S. Government has certain rights in this invention.

FIELD OF THE INVENTION

The present invention is directed to a method and system for determining the state of electrical conductors and/or associated systems and utilizing a non-invasive sensor and a magnetostrictive response from the current of the electrical conductor.

BACKGROUND OF THE INVENTION

The issue of power quality is a perpetual concern for those providing power to and those operating electrical systems and machinery. Electrical systems, particularly aging electrical systems, suffer from degradation, surges and/or fault conditions. The anomalies that contribute to power quality degradation can be initiated by either external or internal causes. External causes such as lightning strikes, weather conditions and utility company faults, or even human error, can be devastating to a power system. Likewise, internal or local environment causes include the use of equipment or activation or deactivation of equipment causing rushes of current and transient voltages to travel on the power transmission or distribution lines, potentially damaging the circuitry of electronic equipment coupled thereto.

Monitoring these systems, for example for fault detection and/or specific high-frequency monitoring, can be expensive and may involve equipment that are part of the electrical circuit and/or may cause additional issues with respect to the power quality. In addition, determining the location of a fault condition, particularly in large systems or in the case of distributed power, can be difficult and/or expensive.

The implementation of a microgrid and transitioning from centralized utility interconnected distributed energy resources (DER) to intentional islanded systems and back, creates unique and challenging situations for conventional protection equipment and methods and this innovation can be implemented into locations that enhance the resolution, detection, and annunciation of events on the utility electrical power system.

Devices utilizing magnetostrictive properties have been known for tagging and identification of devices. For example, U.S. Pat. No. 10,260,969, issued Apr. 16, 2019, entitled "Microfabricated Magnetostrictive Resonator", which is incorporated by reference in its entirety, discloses a tagging system that responds with a specific frequency response to an AC interrogation signal.

What is needed are non-invasive methods or systems for determining the state of one or both of an electrical conductor or an associated system that overcome the limitations of the prior art.

SUMMARY OF THE INVENTION

The present disclosure is directed to a method and system for determining the state of one or both of an electrical conductor or an associated system utilizing a non-invasive sensor and a magnetostrictive response from the current of the electrical conductor.

According to an embodiment, the present disclosure includes a method for determining a state of one or both of an electrical conductor or an associated system. The method includes providing a sensor assembly including a magnetostrictive resonator sensor and a signal detector. A first frequency profile is obtained from the magnetostrictive resonator sensor. A second frequency profile is obtained from the magnetostrictive resonator sensor. The first frequency profile and the second frequency profile are transmitted to a fault detector. The state of the electrical conductor and/or the associated system is determined with the fault detector in response to the first frequency profile and the second frequency profile. The sensor assembly is arranged and disposed to provide the magnetostrictive resonator sensor in sufficiently close proximity to the electrical conductor to permit a magnetostriction effect between the electrical conductor and the magnetostrictive resonator sensor. According to another embodiment of the disclosure, the method also includes interrogating the magnetostrictive resonator sensor with an interrogator at an interrogation frequency. In this embodiment, the first frequency profile and the second frequency profile from the magnetostrictive resonator sensor are in response to the interrogation frequency.

According to an embodiment, the disclosure includes a fault monitoring system utilizing a magnetostrictive resonator sensor. The system includes a sensor assembly having a magnetostrictive resonator sensor and a signal detector arranged and disposed to measure a frequency profile from the magnetostrictive resonator sensor. The sensor assembly is arranged and disposed to provide the magnetostrictive resonator sensor in sufficiently close proximity to the electrical conductor to permit a magnetostriction effect between the electrical conductor and the magnetostrictive resonator sensor. According to another embodiment of the disclosure, the system also includes a fault detector in electrical communication from the sensor assembly. The fault detector is configured to receive the frequency profile from the magnetostrictive resonator sensor.

According to an embodiment, the disclosure includes a system for determining a state of one or both of an electrical conductor or an associated system. The system includes a sensor assembly arranged and disposed to receive a magnetic frequency response from the electrical conductor and at least one processor. In addition, the system includes a non-transitory, computer-readable medium having instructions stored thereon that are executable by the at least one processor to cause the system to obtain a first frequency profile and a second frequency profile from the sensor assembly and determining the state of the electrical conductor and/or the associated system from the first frequency profile and the second frequency profile.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Advantages of embodiments of the present disclosure include a method and system for measuring a state of an electrical conductor in an individual component or the state of an associated system with a non-invasive sensor. The method and system allow calculation of the state to use frequency-selective current detection to sense asset health, imminent asset failures, or actual asset failures, including catastrophic events (such as faults). In field applications, sensor assemblies may be located near current carrying conductors (CCC) or electrical conductors and will respond to frequency composition of current without touching the CCC or being a part of the circuit. Conditions and/or the state that may be determined includes slowly increasing ground fault current, frequencies (indicative of degradation or arc faults), instantaneous excessive harmonic(s) composition (indicative of many abnormal behavior) and other parasitic faults (such as ground or line-to-line faults).

Figure 1:
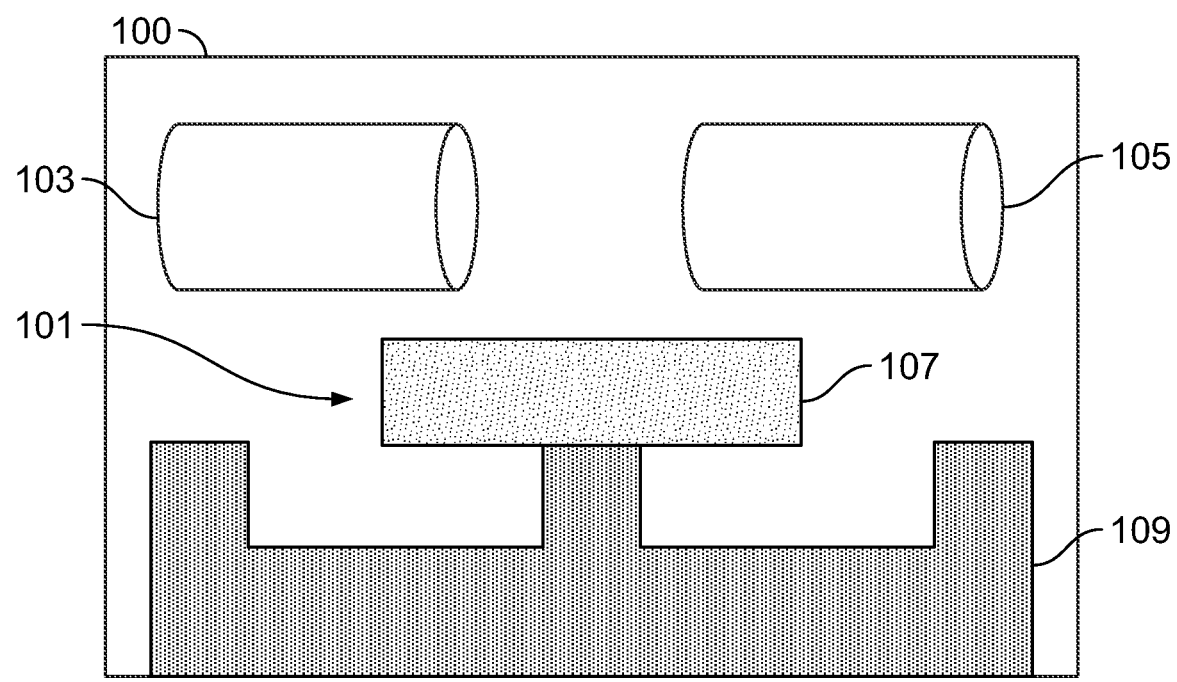
FIG. 1 illustrates a schematic view of a sensor assembly according to an embodiment of the present disclosure.

FIG. 1 shows a sensor assembly 100 according to an embodiment of the present disclosure. Sensor assembly 100 includes a magnetostrictive resonator sensor 101 and a signal detector 103 arranged and disposed to measure a frequency profile from the magnetostrictive resonator sensor 101. When magnetostrictive resonator sensor 101 is in sufficiently close proximity to an AC electrical conductor (i.e., an electrical conductor carrying alternating current (AC)), the alternating magnetic field generated by the alternating current creates a frequency profile of alternating intensities of the magnetic field. Magnetoelastic resonator 101 generates an AC magnetic response signal when subjected to an externally applied alternating (AC) magnetic interrogation signal. FIG. 1 shows an embodiment where sensor assembly 100 includes an interrogator 105 arranged and disposed to interrogate magnetostrictive resonator sensor 101 with an interrogation signal at an interrogation frequency.

Magnetostrictive resonator sensor 101 includes a resonating structure 107 and may include a planar film. Alternatively, the resonating structure 107 may include one or more resonating structures 107 (e.g., resonator portions). Resonating structure 107 have a geometry and are formed from a material that respond to an applied magnetic field. The resonating structure 107 can be a planar film with any useful geometry (e.g., including one or more resonator portions or, alternatively, including a planar, non-patterned layer). In FIG. 1, the resonating portion 107 is a rectangular prism. In the embodiment wherein the resonating portion 107 is a rectangular prism, the prism includes a length (L) and magnetic bias angle β determines its resonance frequency. When activated by an externally applied AC magnetic field, the resonating structure 107 vibrates mechanically due to the Joule effect (i.e., the material strain induced by an applied magnetic field known as magnetostriction). Resonating structure 107 continues to vibrate, generating its own AC magnetic response signal detectable by the same external loop antenna. Suitable magnetostrictive resonator sensors 101 may be fabricated utilizing any suitable technique. For example, the magnetostrictive resonator sensor 101 may be fabricated according to U.S. Pat. No. 10,260,969, issued Apr. 16, 2019, entitled "Microfabricated Magnetostrictive Resonator", which is incorporated by reference in its entirety.

In the embodiment shown in FIG. 1, the magnetostrictive resonator sensor 101 includes a resonating structure 107 (e.g., a $Co_xFe_y$ film) located on top of a base structure 109 (e.g., silicon base) or between two base structures 109, thereby forming a composite. The film can be deposited directly on a surface of the base structure 109. Alternatively, the film can be embedded within a matrix (e.g., an epoxy or polymer matrix), which in turn is in contact with at least a portion of the surface of the base structure 109. Thus, the magnetostrictive resonator sensor 101 includes, at least, a magnetostrictive material (e.g., a $Co_xFe_y$ film) as resonating structure 107 and a base structure 109. The magnetostrictive resonator sensor 101 may have any useful form, such as a stack, a laminate structure, a monolithic structure, etc.

Furthermore, the resonating structure 107 may include a plurality of resonating portions or resonators. The presence of multiple resonators of varying lengths and magnetic bias angles result in a multi-frequency signal that becomes the resonator's identity. That is, a plurality of resonating structures 107 may be utilized to monitor multiple frequencies, which have distinct responsive frequencies in response to exposure to AC magnetic field either from an electrical conductor 203 or from an interrogator 105. For instance, microfabricated arrays can include a plurality of magnetoelastic longitudinal mode resonators. In some embodiments, each resonating structure 107 includes a suspended magnetostrictive $Co_xFe_y$ structure (e.g., resonator portion(s)) deposited and patterned by electrodeposition. In other embodiments, the resonating structure 107 is integrated with a permanent biasing magnet to achieve the optimal magnetoelastic operating point.

The resonating structure 107 of magnetostrictive resonator sensor 101 may be formed from any useful magnetostrictive material, e.g., having a saturation magnetostriction $\lambda_{sat}$ more than about 10 ppm, 20 ppm, 30 ppm, 40 ppm, 50 ppm, 60 ppm, 70 ppm, 80 ppm, 90 ppm, 100 ppm, 125 ppm, 150 ppm, 175 ppm, 200 ppm, 225 ppm, 250 ppm, 275 ppm, or more. Exemplary magnetostrictive materials include CoFe alloys (e.g., $Co_{1-x}Fe_x$ alloys, where $0.1 \leq x \leq 0.9$, such as $Co_{0.66}Fe_{0.34}$, $Co_{0.7}Fe_{0.3}$, $Co_{0.8}Fe_{0.2}$, or $Co_xFe_y$ alloys, as described herein); FeGa alloys (e.g., $Fe_{1-x}Ga_x$ alloys, where $0 < x \leq 0.35$, $0.04 < x < 0.35$, or $0.04 < x < 0.27$, such as in Galfenol); FeGaAl alloys (e.g., $Fe_{(20-y)}$ at % $Ga_y$ at % Al, where $0 < y \leq 15$; and Fe— (27.5–y) at. % $Ga_y$ at % Al, where $0 \leq y \leq 14$); FeAl alloys (e.g., $Fe_{1-x}Al_x$, where $0 < X \leq 0.35$, such as in Alfenol); FeSiB alloys (e.g., alloys having 85-95 wt. % Fe, 5-10 wt. % Si, and 1-5 wt. % B, such as Metglas®. 2605SA1 and 2605HB1M having $\lambda_{sat}$ of about 27 ppm, available from Metglas®., Inc., Conway, S.C.); FeCrSiB alloys (e.g., alloys having 85-95 wt. % Fe, 1-5 wt. % Cr, 1-5 wt. % Si, and 1-5 wt. % B, such as Metglas®. 2605S3A having $\lambda_{sat}$ of about 20 ppm, available from Metglas®., Inc.); NiFeMoB alloys (e.g., alloys having 40-50 wt. % Ni, 40-50 wt. % Fe, 5-10 wt. % Mo, and 1-5 wt. % B, such as Metglas®. 2826 MB having $\lambda_{sat}$ of about 12 ppm, available from Metglas®., Inc.); FeSiBC alloys (e.g., alloys having about 81 wt. % Fe, about 3.5 wt. % Si, about 13.5 wt. % B, and about 2 wt. % C, such as Metglas®. 2605SC ($Fe_{81}Si_{3.5}B_{13.5}C_2$)); FeSeBC alloys; $SmFe_2$-based alloys (e.g., $Sm_xDy_{1-x}Fe_y$, where $0.14 < x < 0.9$ and $1.9 < y \leq 2$, such as $Sm_{0.86}Dy_{0.14}Fe_{e2}$ in Samfenol-D; or $Sm_xEr_{1-x}Fe_y$, where $0.14 < x < 0.9$ and $1.9 < y \leq 2$, such as in Samfenol-E); FeRh alloys (e.g., such as that described in Ibarra M R et al., "Giant volume magnetostriction in the FeRh alloy," Phys. Rev. B 1994 August; 50 (6): 4196-9); $DyFe_2$-based alloys (e.g., $(Dy_{0.33}Fe_{0.67})_{1-x}B_x$, where $0 \leq x \leq 0.1$); $TbFe_2$-based alloys (e.g., $Tb_xDy_{1-x}Fe_y$, where $0.27 < x < 0.3$ and $1.9 < y \leq 2$, such as $Tb_{0.3}Dy_{0.7}Fe_{1.92}$ in Terfenol-D®. having $\lambda_{sat}$ of about 1000-2000 ppm), as well as other NiFeCo-based alloys (e.g., a FeNiCoTi-based alloys, such as $Fe_{31.9}Ni_{9.8}Co_{4.1}Ti$, where subscripts refer to atomic %, as described in Kakeshita T et al., "Magnetic field-induced martensitic transformation and giant magnetostrictions in Fe—Ni—Co—Ti and ordered $Fe_3Pt$ shape memory alloys," Mater. Trans. JIM 2000; 41 (8): 882-7). In particular embodiments, the magnetostrictive material is any alloy having $\lambda_{sat}$ of about 10 to about 275 ppm or more than about 10 ppm, 20 ppm, 30 ppm, 40 ppm, 50 ppm, 60 ppm, 70 ppm, 80 ppm, 90 ppm, 100 ppm, 125 ppm, 150 ppm, 175 ppm, 200 ppm, 225 ppm, 250 ppm, 275 ppm, or more.

Base structure 109 of magnetostrictive resonator sensor 101 may be any suitable material for supporting the resonating structure 107, while permitting mechanical oscillations with limited dampening. In other embodiments, the base structure 109 includes an interface (e.g., a post) configured to attach to the resonator portion(s) and to allow vibration of the resonator portion(s). Exemplary materials for the base structure 109 include a polymer (e.g., polystyrene), a metal (e.g., Si), or glass, optionally including one or more damping layers (e.g., an electrostatic coating, a polymer coating, and/or a coating that includes one or more particles or fibers). In other embodiments, the base structure 109 can include a seeding layer (e.g., a copper layer) to assist in electrodeposition of the magnetostrictive material.

The magnetostrictive resonator sensor 101 may include one or more coatings. Such coatings can be useful for altering the physical properties of the magnetostrictive resonator sensor 101.

Magnetostrictive resonator sensor 101 includes a magnetoelastic material, as described above, that respond to externally applied magnetic fields. Exposure of the resonating structure 107 to a time-varying, externally applied magnetic signal (e.g., an AC magnetic frequency profile from an electrical conductor or an AC magnetic interrogation signal from an interrogator 105) results in Joule magnetostriction, $\lambda = \Delta L/L$ (i.e., a physical deformation characterized by change in length $\Delta L$, where $\lambda_{sat}$ is the value $\lambda$ at saturation). In addition, this exposure generates longitudinal vibrations, which in turn produces elastic waves that emit a magnetic response signal (e.g., an AC magnetic response signal). The emitted response signal can be detected in any useful way, e.g., by magnetic, acoustic, and/or optical systems. Conversely, exposure to an external mechanical stress or strain results in a change in magnetostriction, termed the Villari effect. Thus, a pristine surface and a structurally flawed surface exhibit different magnetostriction, $\lambda$, when exposed to an applied magnetic field.

As discussed above, sensor assembly 100 as shown in FIG. 1, includes a magnetostrictive resonator sensor 101 and a signal detector 103 arranged and disposed to measure a frequency profile from the magnetostrictive resonator sensor 101. When magnetostrictive resonator sensor 101 is in sufficiently close proximity to an AC electrical conductor 203 (i.e., an electrical conductor 203 carrying alternating current (AC)), the alternating magnetic field generated by the alternating current creates a frequency profile of alternating intensities of the magnetic field. Magnetoelastic resonator sensor 101 generates an AC magnetic response signal when subjected to an externally applied alternating (AC) magnetic interrogation signal. FIG. 1 shows an embodiment where sensor assembly 100 includes an interrogator 105 arranged and disposed to interrogate magnetostrictive resonator sensor 101 with an interrogation signal at an interrogation frequency. Magnetostrictive resonator sensor 101 can be interrogated by any useful technique, e.g., by using the interrogator 105. Interrogator 105 may include, but is not limited to an external loop antenna that generates an AC magnetic field, which causes the resonating structure 107 to vibrate mechanically due to the Joule effect (i.e., the material strain induced by an applied magnetic field known as magnetostriction). Upon removal of the interrogation signal, the resonating structure 107 may continue to vibrate, thereby generating its own AC magnetic response signal that is detectable by signal detector 103. Suitable devices for use as the signal detector 103 may include, but are not limited to a receiving loop antenna, the same transmitting antenna switched to a receiving circuit, or any detector described herein.

Signal detector 103 may include any useful components to provide and/or detect signals (e.g., interrogation signals and/or response signals). Exemplary components for signal detector 103 may include, but is not limited to, an excitation circuit configured to provide one or more interrogation signals (e.g., including one or more of a frequency domain sine wave generator, a time domain pulse generator, an AC excitation circuit (e.g., including an input from a direct digital synthesis component, a potentiometer, and/or one or more amplifiers)), and/or a DC excitation circuit (e.g., including a voltage source, a potentiometer, an inductor, and/or one or more amplifiers); an excitation coil to provide a magnetic interrogation signal (e.g., one or more of Helmholtz coils, pick-up coils, solenoid coils, AC coils, and/or DC coils, which can optionally also serve as the sensing coil); a bias coil to provide a rotating bias field (e.g., one or more of Helmholtz coils); one or more electronic switches (e.g., for use in combination with one coil capable of both providing an interrogation signal and receiving a response signal, where the electronic switch isolates excitation and receiving circuits); a permanent biasing magnet to achieve the optimal $\lambda_{sat}$ operating point; a power supply (e.g., a supply to provide current to one or more coils); a multimeter; a laser emitter to detect magnetostriction of the resonator (e.g., a light-emitting diode or a laser that is aligned to reflect off of a surface of the resonator); a detector to detect one or more response signals (e.g., a microphone to detect an acoustic response signal, a sensing coil to detect a magnetic response signal (e.g., any coil described herein optionally in combination with a multiplexer), and/or a phototransistor to detect an optical response signal (e.g., optionally in combination with one or more mirrors, beam splitters, coarse sensors, fine sensors, piezoelectric translators, locked-in amplifiers, oscillators, and/or phase shifters); and/or a receiving circuit configured to process one or more response signals (e.g., including one or more of a microcontroller (e.g., to control any components described herein, such as one or more excitation circuits and one or more detectors), a multichannel analog-to-digital converter (ADC), a frequency domain lock in amplifier, a time domain digital oscilloscope, a network impedance analyzer, a phase detection circuit (e.g., including a comparator, an XOR gate, an ADC, and/or a filter), and/or an amplitude detection circuit (e.g., including on amplifier, an RMS-DC converter, and/or an ADC)).

While FIG. 1 shows interrogator 105 and signal detector 103 as separate devices, in one embodiment, the interrogator 105 and signal detector 103 may be incorporated into a unitary device.

Interrogation and response signals, such as those provided and detected by signal detector 103 and interrogator 105, may be provided and detected in any useful format. In some embodiments, the magnetostrictive resonator sensor 101 relies on a time-domain measurement technique, where the interrogation signal is a sinusoidal magnetic field impulse (e.g., using an excitation coil) and the response signal is a time-domain response that can be analyzed in any useful way. For example, the signal detector 103 is configured to determine the resonance frequency by converting the response to a frequency spectrum and then identifying the peak in that spectrum (e.g., with a Fast Fourier Transform algorithm or with statistical fitting by a Poisson process) or by counting the number of oscillations for a given period (e.g., with frequency counting). In other embodiments, the magnetostrictive resonator sensor 101 relies on a frequency-domain measurement technique, where the interrogation signal is a fixed-frequency, steady state signal, and the response signal is detected by sweeping a frequency range and by determining the frequency that provides the maximum amplitude signal. In yet another embodiment, the signal detector 103 relies on an impedance de-tuning method, where the resonator tag interacts with an inductive solenoid, and the response signal is the change in impedance of the solenoid measured as a function of frequency (e.g., by using a network impedance analyzer).

Figure 2:
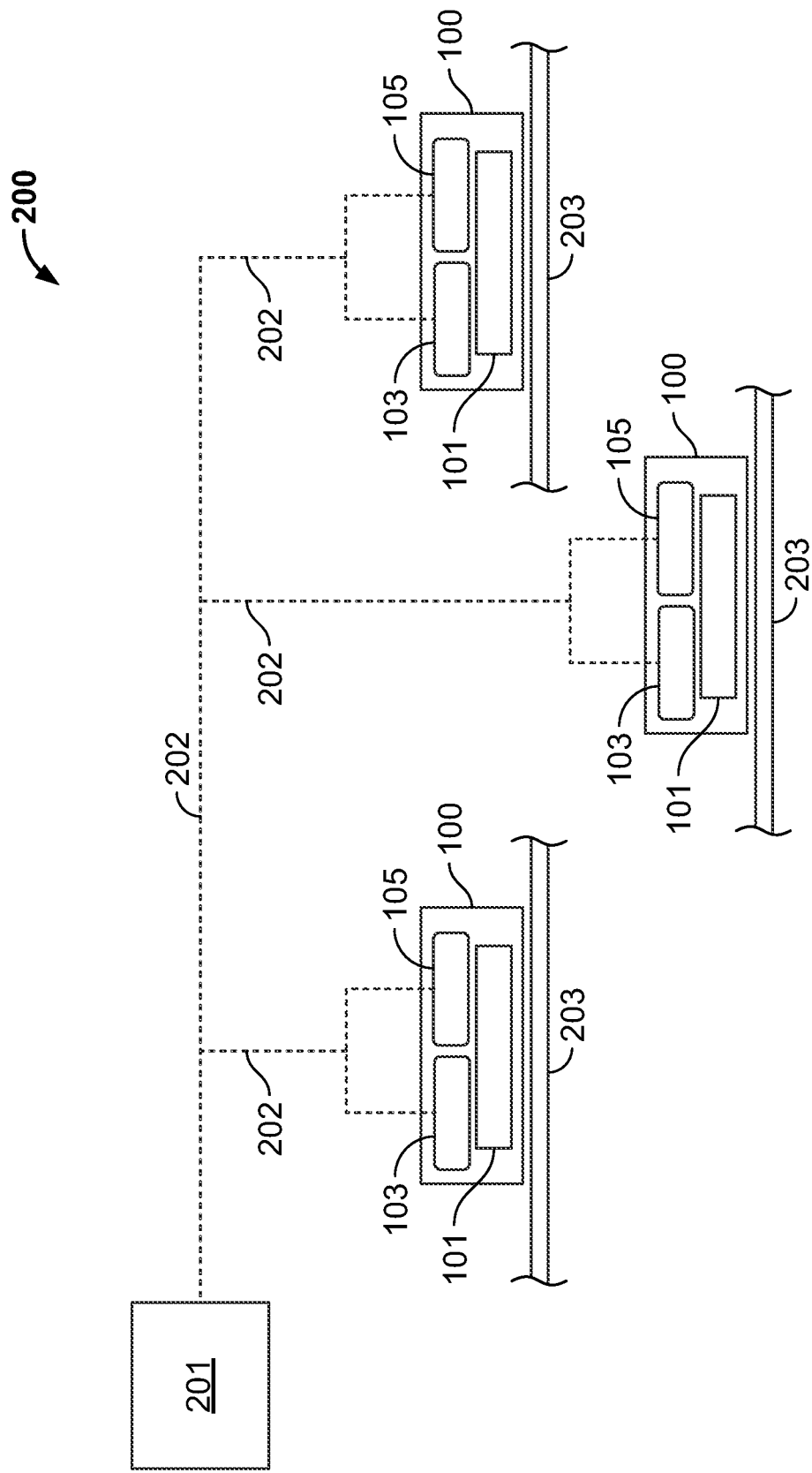
FIG. 2 illustrates a schematic view of a fault monitoring system according to an embodiment of the present disclosure.

FIG. 2 shows a fault monitoring system 200 according to an embodiment of the present disclosure. Fault monitoring system 200 includes a fault detector 201 in electrical communication with sensor assembly 100 via signal lines 202. While signal lines 202 may include physical lines, the signals may also be sent wirelessly. Fault detector 201 is configured to receive the frequency profile from the magnetostrictive resonator sensor 101. The sensor assembly 100 is arranged and disposed to provide the magnetostrictive resonator sensor 101 in sufficiently close proximity to the electrical conductor 203 to permit a magnetostriction effect between the electrical conductor 203 and the magnetostrictive resonator sensor 101. The magnetostriction effect, as utilized herein, is mechanical vibration of the resonating structure 107 of the magnetostrictive resonator sensor 101 induced due to the Joule effect in response to AC magnetic fields, such as from either an electrical conductor 203 or from an interrogator 105. Determination of a fault condition or other state of the electrical conductor 203 may also provide a location within the fault monitoring system 200 by sensing the state and providing the location of the measured state. Such fault locations can be reported to the fault detector 201, where the fault monitoring system 200 may be monitored and appropriate action may be taken in response to the measured state. While FIG. 2 shows a fault monitoring system 200 with sensor assemblies 100 arranged in sufficiently close proximity to the electrical conductor 203 to permit a magnetostriction effect between the electrical conductor 203 and the magnetostrictive resonator sensor 101, the fault monitoring system 200 may also be utilized to determine the state of associated systems to electrical conductor 203. Associated systems, as utilized herein, are electrical systems that utilize electrical conductors 203 and may include, but are not limited to power loads, such as electrical motors or heaters, power transmission, and/or power generation, such as photovoltaic generation.

Figure 3:
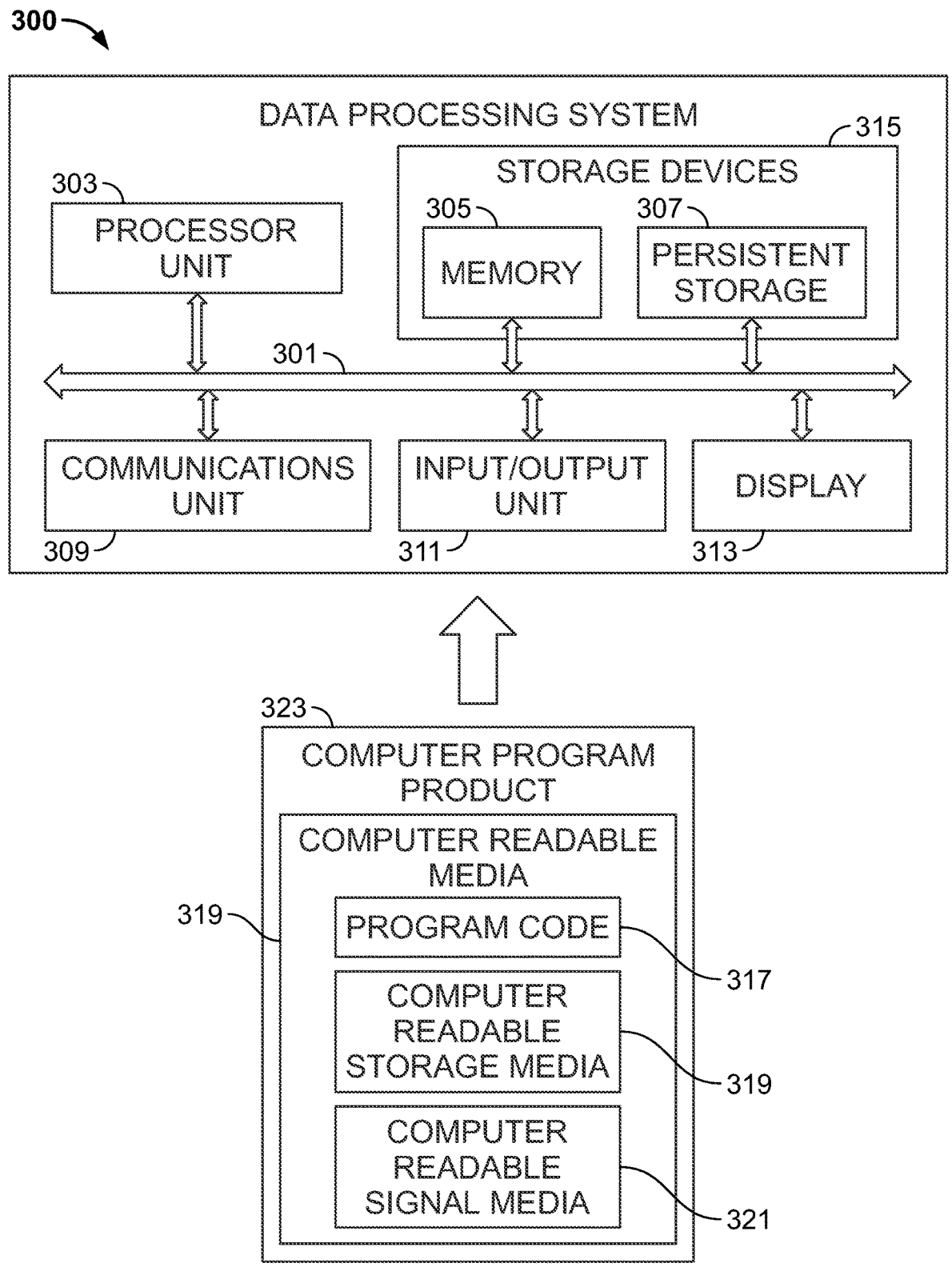
FIG. 3 illustrates a data processing system according to an embodiment of the present disclosure.

Fault detector 201 may include a data processing system 300 that is capable of analyzing frequency profiles and determining a state of an electrical conductor 203 and/or an associated system. FIG. 3 shows an illustration of a data processing system 300 as depicted in accordance with an illustrative embodiment. Data processing system 300 in FIG. 3 is an example of a data processing system 300 that may be used to implement the illustrative embodiments. In this illustrative example, data processing system 300 includes communications fabric 301, which provides communications between processor unit 303, memory 305, persistent storage 307, communications unit 309, input/output (I/O) unit 311, and display 313.

Processor unit 303 may be a number of processors, a multi-processor core, or some other type of processor, depending on the particular implementation. A number, as used herein with reference to an item, means one or more items. Further, processor unit 303 may be implemented using a number of heterogeneous processor systems in which a main processor is present with secondary processors on a single chip. As another illustrative example, processor unit 303 may be a symmetric multi-processor system containing multiple processors of the same type.

Memory 305 and persistent storage 307 are examples of storage devices 315. A storage device 315 is any piece of hardware that is capable of storing information, such as, for example, without limitation, data, program code 317 in functional form, and/or other suitable information either on a temporary basis and/or a permanent basis. Storage devices 315 may also be referred to as computer readable storage devices in these examples. Memory 305, in these examples, may be, for example, a random access memory 305 or any other suitable volatile or non-volatile storage device 315. Persistent storage 307 may take various forms, depending on the particular implementation.

For example, persistent storage 307 may contain one or more components or devices. For example, persistent storage 307 may be a hard drive, a flash memory, a rewritable optical disk, a rewritable magnetic tape, or some combination of the above. The media used by persistent storage 307 also may be removable. For example, a removable hard drive may be used for persistent storage 307.

Communications unit 309, in these examples, provides for communications with other data processing systems 300 or devices. In these examples, communications unit 309 is a network interface card. Communications unit 309 may provide communications through the use of either or both physical and wireless communications links.

Input/output (I/O) unit 311 allows for input and output of data with other devices that may be connected to data processing system 300. For example, input/output (I/O) unit 311 may provide a connection for user input through a keyboard, a mouse, and/or some other suitable input device. Further, input/output (I/O) unit 311 may send output to a printer. Display 313 provides a mechanism to display information to a user.

Instructions for the operating system, applications, and/or programs may be located in storage devices 315, which are in communication with processor unit 303 through communications fabric 301. In these illustrative examples, the instructions are in a functional form on persistent storage 307. These instructions may be loaded into memory 305 for execution by processor unit 303. The processes of the different embodiments may be performed by processor unit 303 using computer implemented instructions, which may be located in a memory, such as memory 305.

These instructions are referred to as program code 317, computer usable program code, or computer readable program code that may be read and executed by a processor in processor unit 303. The program code 317 in the different embodiments may be embodied on different physical or computer readable storage media 319, such as memory 305 or persistent storage 307.

Program code 317 is located in a functional form on computer readable storage media 319 that is selectively removable and may be loaded onto or transferred to data processing system 300 for execution by processor unit 303. Program code 317 and computer readable storage media 319 form computer program product 323 in these examples. In one example, computer readable storage media 319 may be computer readable storage media 319 or computer readable signal media 321. Computer readable storage media 319 may include, for example, an optical or magnetic disk that is inserted or placed into a drive or other device that is part of persistent storage 307 for transfer onto a storage device 315, such as a hard drive, that is part of persistent storage 307. Computer readable storage media 319 also may take the form of a persistent storage 307, such as a hard drive, a thumb drive, or a flash memory, that is connected to data processing system 300. In some instances, computer readable storage media 319 may not be removable from data processing system 300.

Alternatively, program code 317 may be transferred to data processing system 300 using computer readable signal media 321. Computer readable signal media 321 may be, for example, a propagated data signal containing program code 317. For example, computer readable signal media 321 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 317 may be downloaded over a network to persistent storage 307 from another device or data processing system 300 through computer readable signal media 321 for use within data processing system 300. For instance, program code 317 stored in a computer readable storage medium 319 in a server data processing system 300 may be downloaded over a network from the server to data processing system 300. The data processing system 300 providing program code 317 may be a server computer, a client computer, or some other device capable of storing and transmitting program code 317.

The different components illustrated for data processing system 300 are not meant to provide architectural limitations to the manner in which different embodiments may be implemented. The different illustrative embodiments may be implemented in a data processing system 300 including components in addition to or in place of those illustrated for data processing system 300. Other components shown in FIG. 3 can be varied from the illustrative examples shown. The different embodiments may be implemented using any hardware device or system capable of running program code 317. As one example, the data processing system 300 may include organic components integrated with inorganic components and/or may be comprised entirely of organic components excluding a human being. For example, a storage device 315 may be comprised of an organic semiconductor.

In another illustrative example, processor unit 303 may take the form of a hardware unit that has circuits that are manufactured or configured for a particular use. This type of hardware may perform operations without needing program code 317 to be loaded into a memory 305 from a storage device 315 to be configured to perform the operations.

For example, when processor unit 303 takes the form of a hardware unit, processor unit 303 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, programmable array logic, a field programmable logic array, a field programmable gate array, and other suitable hardware devices. With this type of implementation, program code 317 may be omitted because the processes for the different embodiments are implemented in a hardware unit.

In still another illustrative example, processor unit 303 may be implemented using a combination of processors found in computers and hardware units. Processor unit 303 may have a number of hardware units and a number of processors that are configured to run program code 317. With this depicted example, some of the processes may be implemented in the number of hardware units, while other processes may be implemented in the number of processors.

The different illustrative embodiments can take the form of an entirely hardware embodiment, an entirely software embodiment, or an embodiment containing both hardware and software elements. Some embodiments are implemented in software, which includes but is not limited to forms such as, for example, firmware, resident software, and microcode.

Furthermore, the different embodiments can take the form of a computer program product 323 accessible from a computer usable or computer readable medium providing program code 317 for use by or in connection with a computer or any device or system that executes instructions. For the purposes of this disclosure, a computer usable or computer readable medium can generally be any tangible apparatus that can contain, store, communicate, propagate, or transport the program for use by or in connection with the instruction execution system, apparatus, or device.

The computer usable or computer readable medium can be, for example, without limitation an electronic, magnetic, optical, electromagnetic, infrared, or semiconductor system, or a propagation medium. Non-limiting examples of a computer readable medium include a semiconductor or solid-state memory, magnetic tape, a removable computer diskette, a random access memory (RAM), a read-only memory (ROM), a rigid magnetic disk, and an optical disk. Optical disks may include compact disk-read only memory (CD-ROM), compact disk-read/write (CD-R/W), and DVD.

Further, a computer usable or computer readable medium may contain or store a computer readable or computer usable program code 317 such that when the computer readable or computer usable program code 317 is executed on a computer, the execution of this computer readable or computer usable program code 317 causes the computer to transmit another computer readable or computer usable program code 317 over a communications link. This communications link may use a medium that is, for example, without limitation, physical or wireless.

A data processing system 300 suitable for storing and/or executing computer readable or computer usable program code 317 will include one or more processors coupled directly or indirectly to memory 305 elements through a communications fabric, such as a system bus. The memory 305 elements may include local memory employed during actual execution of the program code 317, bulk storage, and cache memories which provide temporary storage of at least some computer readable or computer usable program code 317 to reduce the number of times code may be retrieved from bulk storage during execution of the code.

Input/output or I/O 311 devices can be coupled to the system either directly or through intervening I/O controllers. These devices may include, for example, without limitation, keyboards, touch screen displays, and pointing devices. Different communications adapters may also be coupled to the system to enable the data processing system 300 to become coupled to other data processing systems 300 or remote printers or storage devices 315 through intervening private or public networks. Non-limiting examples of modems and network adapters are just a few of the currently available types of communications adapters.

Figure 4:
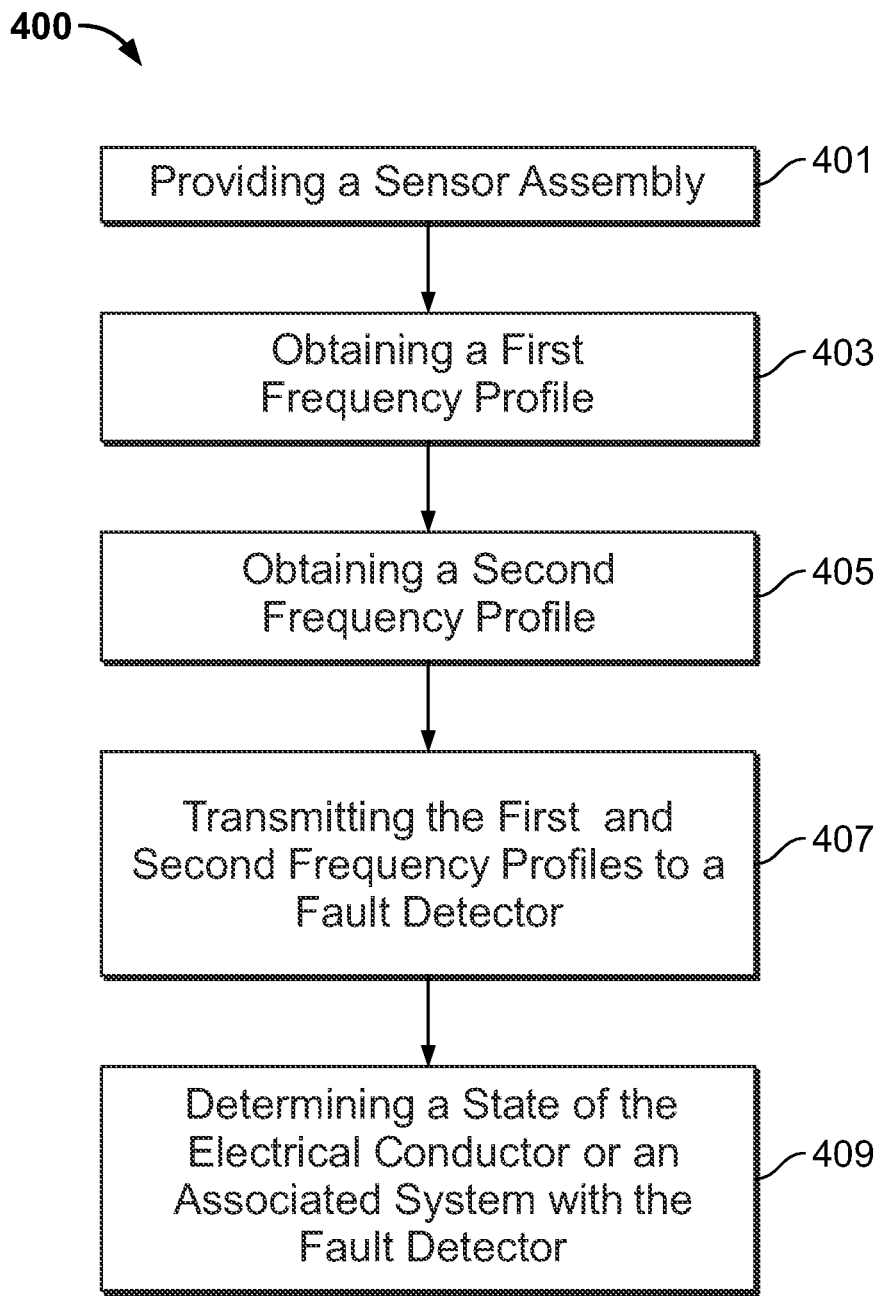
FIG. 4 illustrates a block diagram of a method for determining a state of an electrical conductor according to an embodiment of the present disclosure.

FIG. 4 shows a method 400 for determining a state of an electrical conductor 203 or an associated system according to an embodiment of the present disclosure. Method 400 includes providing a sensor assembly 100 including a magnetostrictive resonator sensor 101 and a signal detector 103 (step 401). The providing may include placing the Magnetostrictive resonator sensor 101 in close proximity to an electrical conductor 203, which has a state to be determined. A first frequency profile of the electrical conductor 203 is obtained from the magnetostrictive resonator sensor 101 (step 403). A second frequency profile of the electrical conductor 203 is obtained from the magnetostrictive resonator sensor 101 (step 405). The first frequency profile and the second frequency profile are transmitted via a wired or wireless connection to a fault detector 201 (step 407). A state of the electrical conductor 203 or an associated system is determined with the fault detector 201 in response to the first frequency profile and the second frequency profile (step 409). The sensor assembly 100 is arranged and disposed to provide the magnetostrictive resonator sensor 101 in sufficiently close proximity to the electrical conductor 203 to permit a magnetostriction effect between the electrical conductor 203 and the magnetostrictive resonator sensor 101 (see for example FIGS. 1 and 2). In another embodiment according to the present disclosure, method 400 includes interrogating the magnetostrictive resonator sensor 101 with an interrogator 105 at an interrogation frequency, wherein the first frequency profile and the second frequency profile from the magnetostrictive resonator sensor 101 are in response to the interrogation frequency.

To determine the state of the electrical conductor 203 and/or an associated system with the fault detector 201, the first frequency profile and the second frequency profile are analyzed using fault monitoring system 200, as shown and described with respect to FIGS. 2 and 3. In one embodiment, the analysis and calculation is performed using a computer system, as shown and described with respect to FIG. 3.

The determination of the state of the electrical conductor 203 and/or an associated system may include, for example, asset health, or asset failures, including catastrophic events (such as faults). For example, the state of the electrical conductor 203 or associated system is determined from the first frequency profile and the second frequency profile may include a condition, such as slow leakage currents (indicative of slow degradation), frequencies (indicative of arc faults), instantaneous excessive harmonic(s) composition (indicative of many abnormal behavior) or other parasitic faults (such as ground or line-to-line faults).

In other embodiments, the state determined is a current of the electrical conductor 203. In order to calculate the current, a sensor assembly 101 according to the present invention is brought into close proximity to the electrical conductor 203. The sensor assembly 101 includes a resonating structure 107 with a characteristic resonance frequency ($f_o$) and resonance response with some full width at half max (FWHM). For example, $\Delta f$, FWHM and $f_o$ may depend upon the specific material of the resonating structure 107. The applied magnetic field causes a shift in this resonance frequency ($\Delta f$) depending on if the magnetic field is parallel or anti-parallel. Since current flow in a conductor causes a magnetic field, measurement of the sensor frequency response is indicative of current flow in the conductor. An alternating current (AC) will cause the resonance frequency to dither around the nominal (no current) resonance frequency. The extent of this dithering (from positive $\Delta f$ to negative $\Delta f$) is related to the magnitude of the AC current.

In one embodiment, in step 409 shown in FIG. 4, a plurality of specific frequencies are monitored. While a full frequency spectrum sweep of frequencies may be utilized, it is desirable to only be able to characterize a single or a few frequencies and recreate the behavior of the entire frequency response. A current magnitude is measured by the shift in peak frequency. The resolution of the sensor is a function of the Q-factor, where $Q=f_r/\Delta f$ where $\Delta f$ is the full width at half maximum (FWHM). For example, the current intensity can be determined by the shape of the frequency response. The shape of the frequency response may be at least partially determined by the FWHM. From this, the intensity of the current can be determined.

$$I=g(f)$$

where I is the expected intensity and f is a given frequency.

With a single specific frequency that is monitored, the current magnitude can be determined at the monitored frequent. With this current magnitude, $f_o+\Delta f$ can be calculated. $f_o+\Delta f$ represents how far the curve has dithered or shifted, which is directly related to the magnitude of the magnetic field. Since the frequency response in most embodiments is symmetric around $f_o+\Delta f$, two solutions are determined depending if you're on the leading or trailing edge of the envelope. Accordingly, in one embodiment, multiple frequencies are monitored as a given instance in time in another embodiment, the response of monitored frequency can be measured in time.

The resolution of the current magnitude is related to the number of frequencies monitored. While not wishing to be bound by theory or explanation, it is believed that the entire envelope can be recreated with only two measured frequencies or a single frequency measured over time. In order to recreate the envelope, the shape of the envelop would be assumed to be static and that there are perfect or near perfect measurement capabilities (e.g., no noise). In these embodiments, monitoring multiple frequency can relax the static and measurement assumptions to a certain degree. That is, increasing the number of monitored frequencies not only increases the resolution, but also the confidence of the back calculation.

In another embodiment, in step 409 shown in FIG. 4, a time series reading for a monitored frequency for a given current may be determined. For example, the time series reading for a specific frequency at a specific frequency can be determined utilizing the response shape and the FWHM of the frequency profile. Current can be determined by taking the measured frequency response and comparing to all known frequency responses (i.e., in the second frequency profile). This embodiment can give a value for the current that minimizes error between expected and measured, which reduces the number of monitored frequencies required to determine the current.

Figure 5:
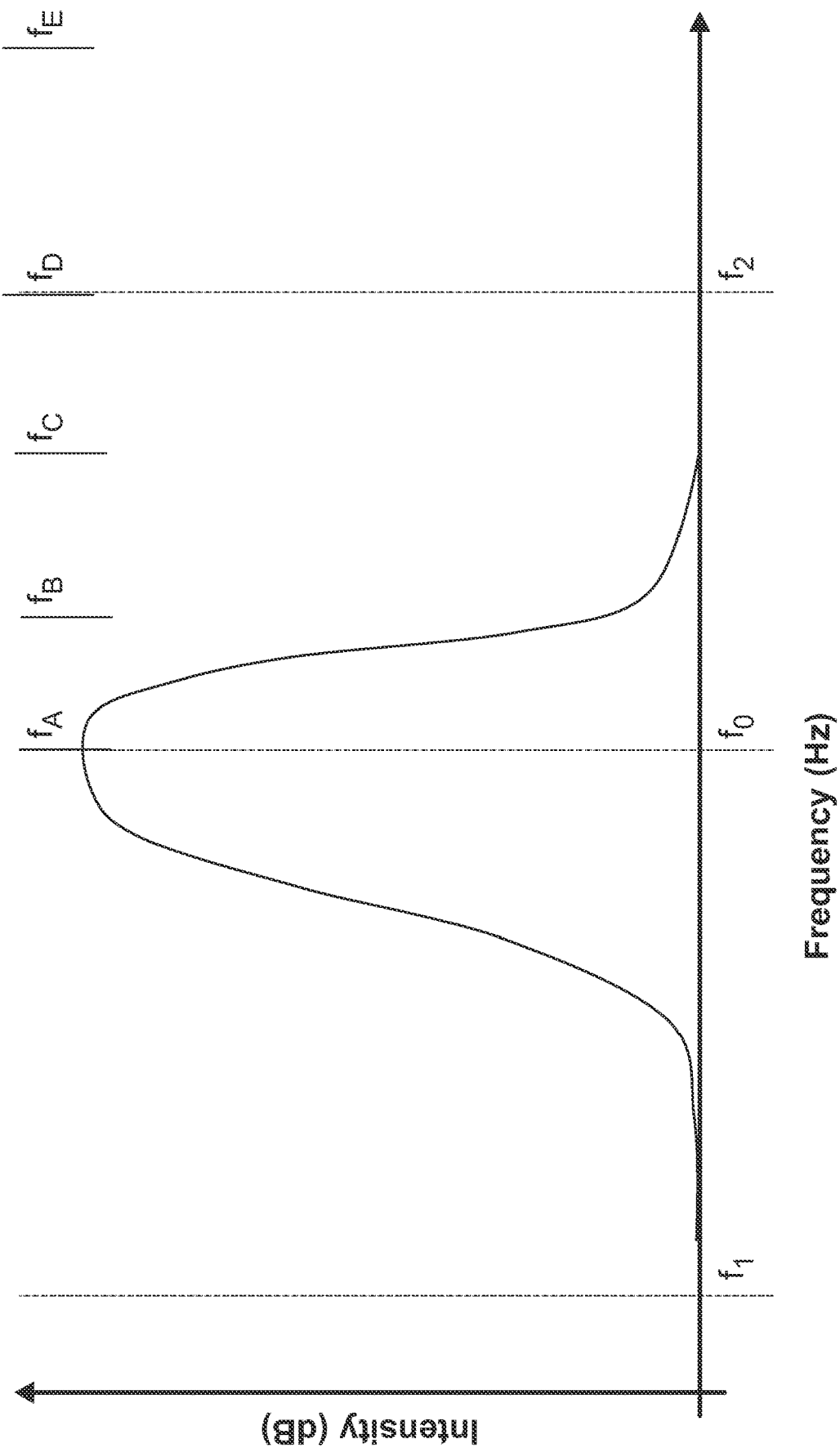
FIG. 5 illustrates an exemplary frequency profile from a magnetostrictive resonator sensor according to an embodiment of the present disclosure.

FIG. 5 shows an exemplary frequency profile, wherein the frequency response (i.e., the intensity in dB) shows a frequency response around a zero current point $f_o$ corresponding to a particular magnetostrictive resonator sensor 101. When monitoring an alternating current in an electrical conductor 203, the frequency peak dithers so that the peak varies between $f_1$ and $f_2$. In order to monitor the electrical conductor 203, the magnetostrictive resonator sensor 101 is configured (e.g., by interrogation by interrogator 105 or by configuration of resonating structure 107) to monitor frequency intensities at each of $f_A$, $f_B$, $f_C$, $f_D$, and $f_E$. While this embodiment shows five distinct frequencies being monitored, the invention is not so limited, and any suitable number of frequencies may be monitored. In one embodiment, the number of frequencies monitored corresponds to a computation infrastructure that collects and analyzes the information in a predetermined measurement time. For example, a suitable measurement time is at least ten times the resonant frequency.

Figure 6:
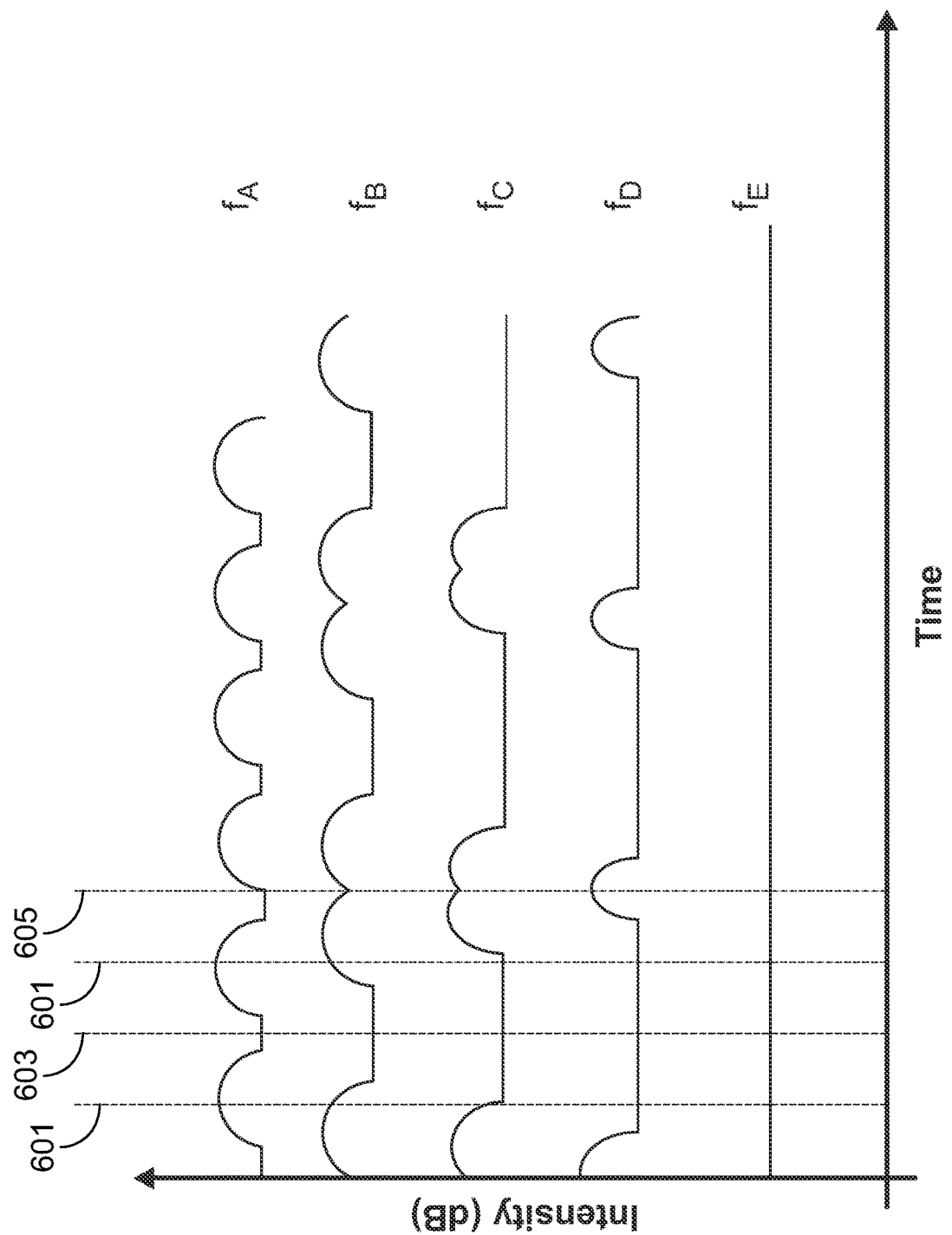
FIG. 6 illustrates a first frequency profile from a magnetostrictive resonator sensor according to another embodiment of the present disclosure.

FIG. 6 shows a first frequency profile utilizing the monitored frequency intensities as shown in FIG. 5. The frequency signal in FIG. 6 represents a response to a current:

$$i = I_0 \cdot \sin(\omega t)$$

In the embodiment shown in FIG. 6, frequency responses are obtained at frequency $f_A$, $f_B$, $f_C$, $f_D$, and $f_E$. In this embodiment, the frequencies correspond to frequency responses from interrogation frequencies corresponding to each of frequencies $f_A$, $f_B$, $f_C$, $f_D$, and $f_E$. The intensity peaks are illustrated at each of the frequencies $f_A$, $f_B$, $f_C$, $f_D$, and $f_E$. As shown in FIG. 6, the $f_0$ peak 601 is the peak at the fundamental frequency $f_0$. In addition, $f_1$ peak 603 and the $f_2$ peak 605 are shown along the frequency responses. The signal response repeats at a frequency of the line signal from the electrical conductor 203. If the dither of the frequency peak is greater than the full width at half maximum (FWHM), then there will be dead time in the frequency profile. Accordingly, the signals further from the fundamental frequency (e.g., $f_B$, $>f_C$, $>f_D$, $>f_E$) have greater dead time in the frequency profile. FIG. 6 shows the increased dead time as the monitored frequencies move from $f_A$ to $f_B$ to $f_C$ to $f_D$ to $f_E$. The lack of presence of a signal at $f_E$ provides an outer limit to the dither of the frequency peak and provides the ability to calculate or estimate the current from the peak shape/FWHM or Δf/A (Hz/A).

Figure 7:
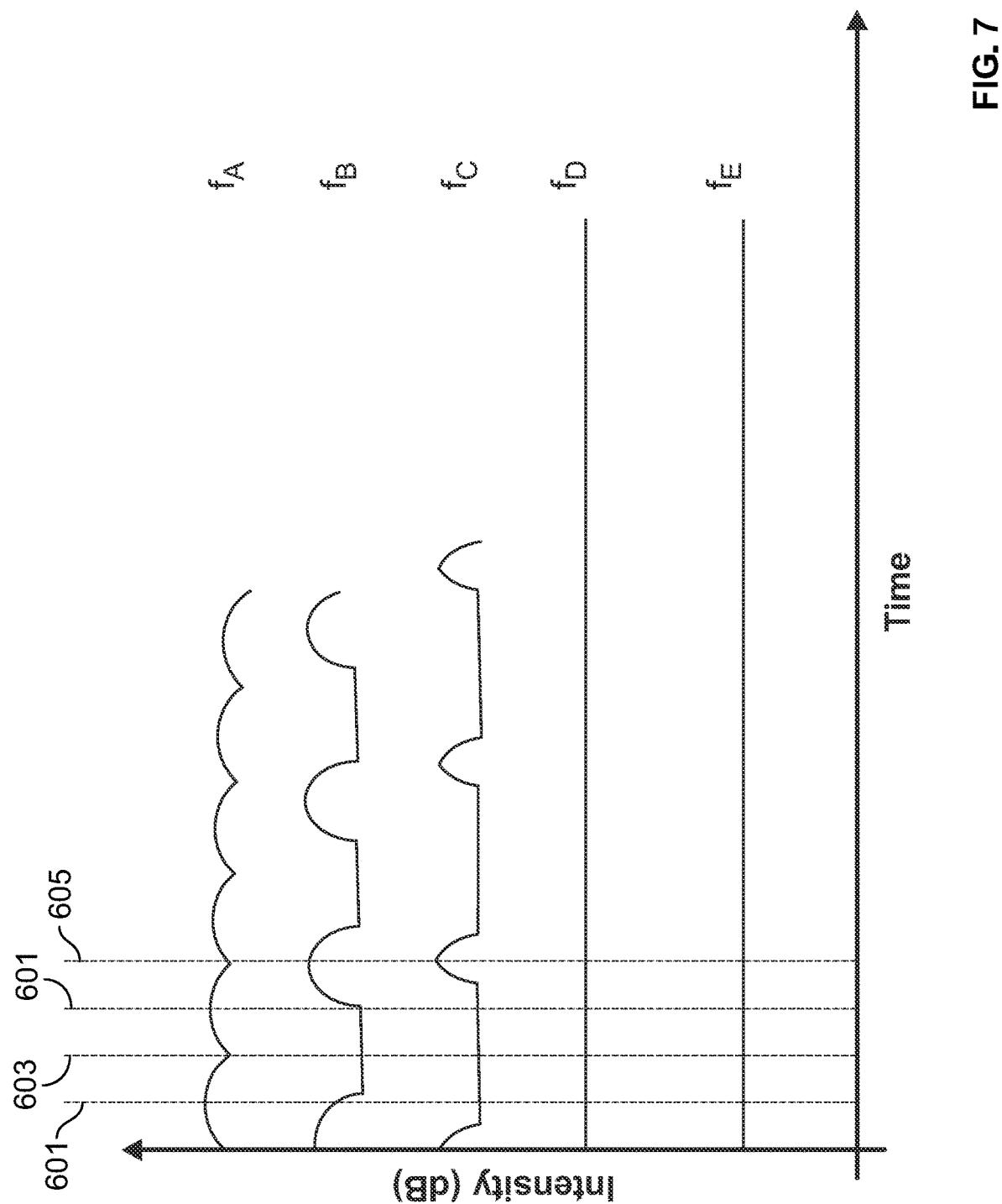
FIG. 7 illustrates a first frequency profile from a magnetostrictive resonator sensor according to another embodiment of the present disclosure.

FIG. 7 shows a first frequency profile utilizing the monitored frequency intensities as shown in FIG. 5. The frequency signal in FIG. 7 represents a response to a current:

$$i = I_1 \cdot \sin(\omega t) \text{ where } I_1 << I_0$$

As in FIG. 6, the intensity peaks are illustrated at each of the frequencies $f_A$, $f_B$, $f_C$, $f_D$, and $f_E$. As shown in FIG. 7, the $f_0$ peak 601 is the peak at the fundamental frequency $f_0$. $f_1$ peak 603 and the $f_2$ peak 605 are shown along the frequency responses. The signals further from the fundamental frequency (e.g., $f_B$, $>f_C$, $>f_D$, $>f_E$) have greater dead time in the frequency profile. FIG. 7 shows the increased dead time as the monitored frequencies move from $f_A$ to $f_B$ to $f_C$ to $f_D$ to $f_E$. The lack of presence of a signal at $f_D$ provides an outer limit to the dither of the frequency peak and provides the ability to calculate or estimate the current from the peak shape/FWHM. These frequency profiles are indicative of levels of current amplitudes.

Figure 8:
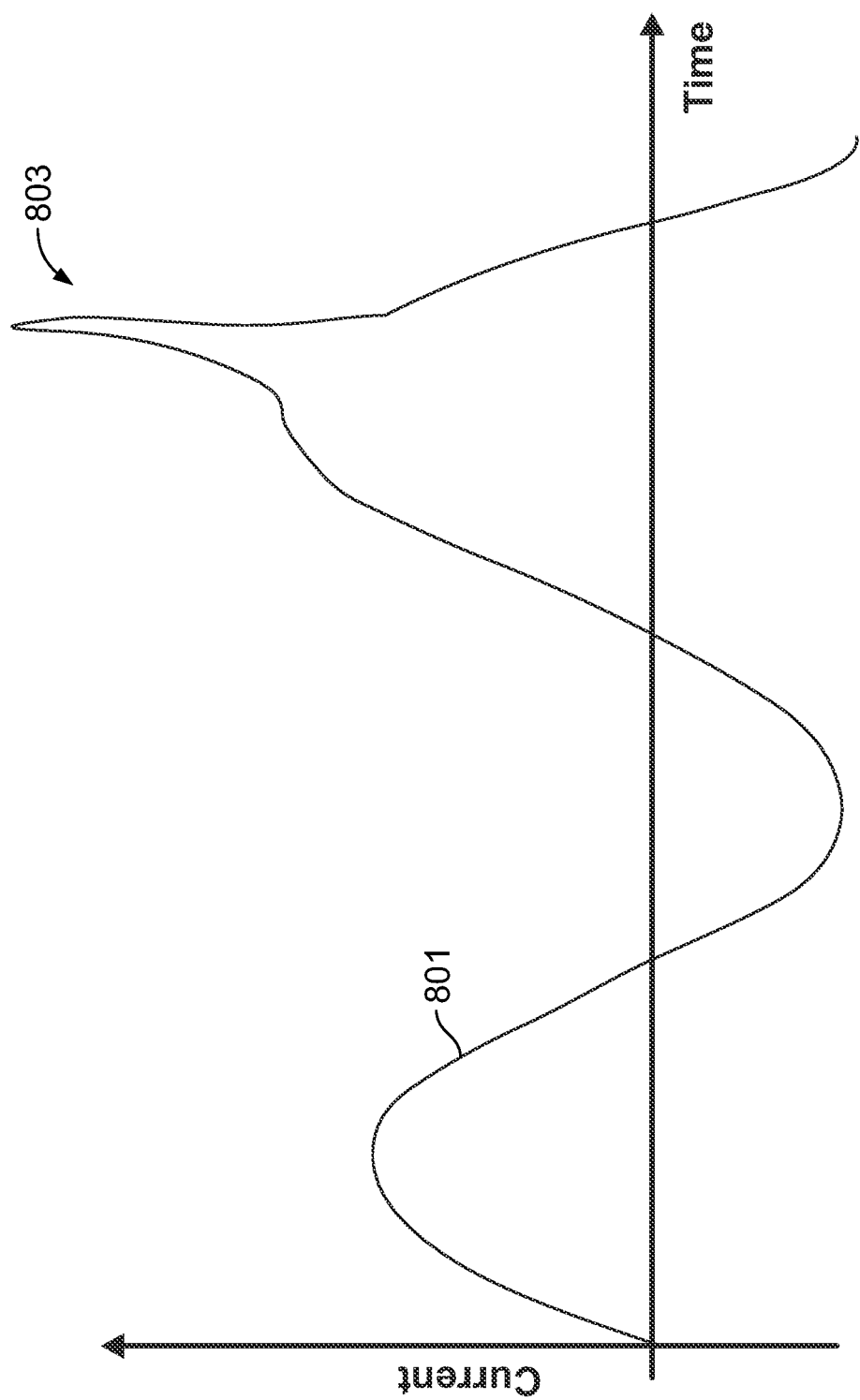
FIG. 8 illustrates a current response in an electrical conductor including a transient condition according to an embodiment of the present disclosure.
Figure 9:
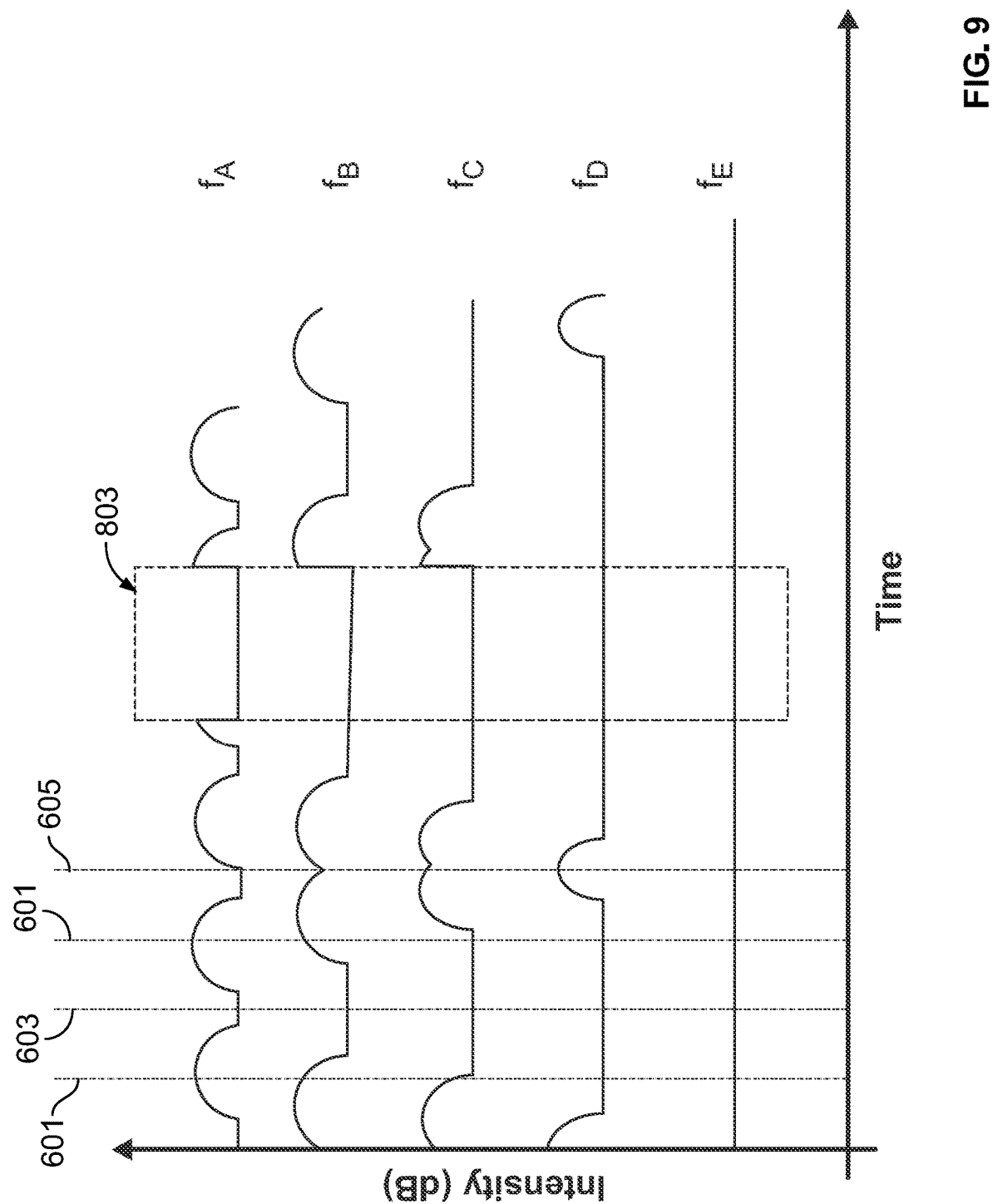
FIG. 9 illustrates a second frequency profile for an operational state including a transient condition according to an embodiment of the present disclosure.

FIG. 8 illustrates a current profile 801 of an electrical conductor 203 including a transient condition 803 according to an embodiment of the present disclosure. The transient condition 803 may result from any number of properties or conditions of the electrical conductor 203, such as, but not limited to a surge or fault condition. FIG. 9, illustrates a second frequency profile for an operational state including a transient condition 803, such as the transient condition 803 shown in FIG. 8. In one embodiment, FIG. 9 shows the response profile according to a second frequency profile. In this embodiment, the second frequency profile is compared to a first frequency profile, such as FIG. 6, and differences determine a state of the conductor or the associated system.

Figure 10:
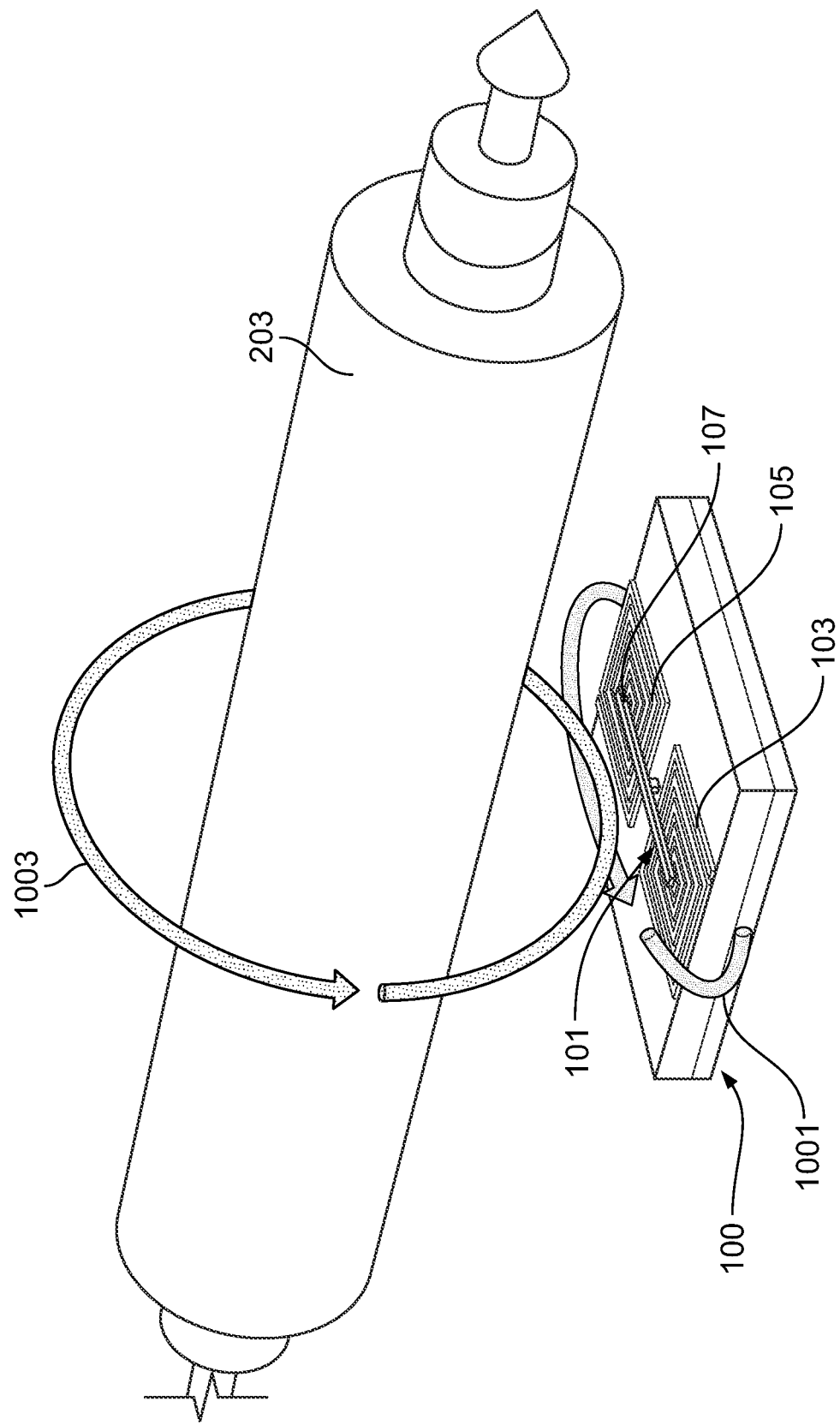
FIG. 10 shows the magnetic field response of a magnetostrictive resonator sensor to an electrical conductor.

FIG. 10 shows the magnetic field response of a magnetostrictive resonator sensor 101 to an electrical conductor 203. As shown and described above with respect to FIG. 1, FIG. 10 includes a sensor assembly 100 according to an embodiment of the present disclosure. Sensor assembly 100 includes a magnetostrictive resonator sensor 101, a signal detector 103 and an interrogator 105. In addition, magnetostrictive resonator sensor 101 includes a resonating structure 107. In order to provide the first and second profiles, the frequency response may be calculated as the magnetomechanical resonance induced by drive coil AC field 1001, $H_{Drive}$, as shown in FIG. 10.

Resonance frequency determined primarily by resonator length, L, DC bias field, $H_B$, and electrical conductor magnetic field 1003 is generated by current carrying wire, $H_I(t)$. Presence of bias field turns the sensor assembly 100 "on" and provides maximum signal amplitude at that field. The resonance frequency may be calculated according to the following equation:

$$f_r = \frac{1}{2L}\left[\sqrt{\frac{\rho}{E_0} + \frac{9\lambda_s^2 \rho ((|H_B + H_I(t)|\cos(\beta)))^2}{J_s H_A^3}}\right]^{-1}$$

where L is the resonator length, ρ is the density of the resonator structure 107, $H_B$ is the DC bias field, $H_I(t)$ is the magnetic field generated by the electrical conductor 203, β is the magnetic bias angle of resonator structure 107, $\lambda_s^2$ is the magnetostriction coefficient of the material of resonator structure 107, $E_0$ is the elastic modulus of the resonator structure 107, $J_s$ is the magnetization of the resonator structure 107, and $H_A$ is the alternating bias field. The presence of $H_I(t)$ superimposed with $H_B$ causing shifts in both frequency and amplitude due to nonlinear behavior in Young's modulus. The first frequency profile may be taken at a first point in time or may be set according to historical or stored values and the second frequency profile may be taken at a second point of time.

Figure 11A:
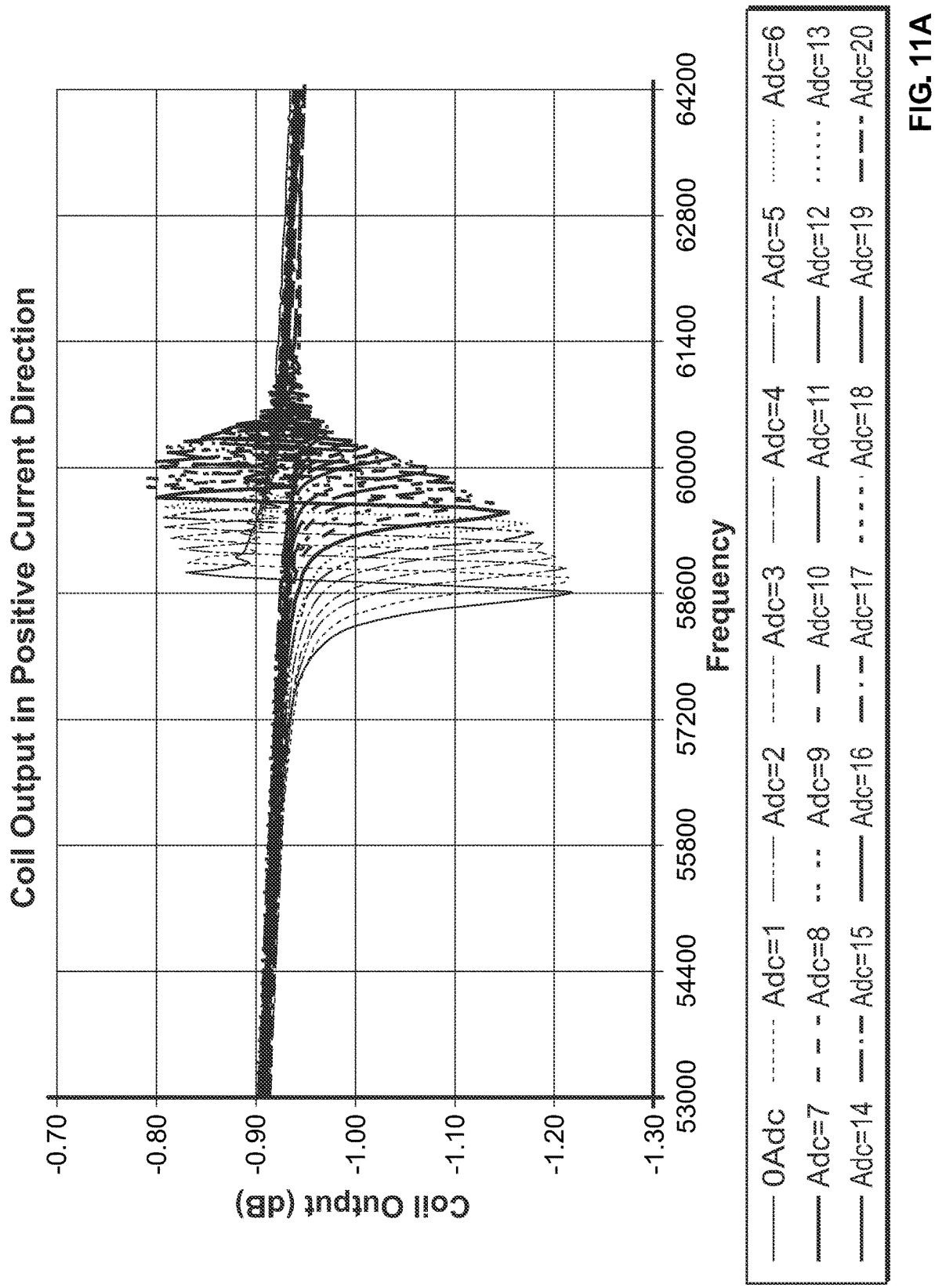
FIG. 11A shows a coil output for the signal detector according to the present disclosure.
Figure 11B:
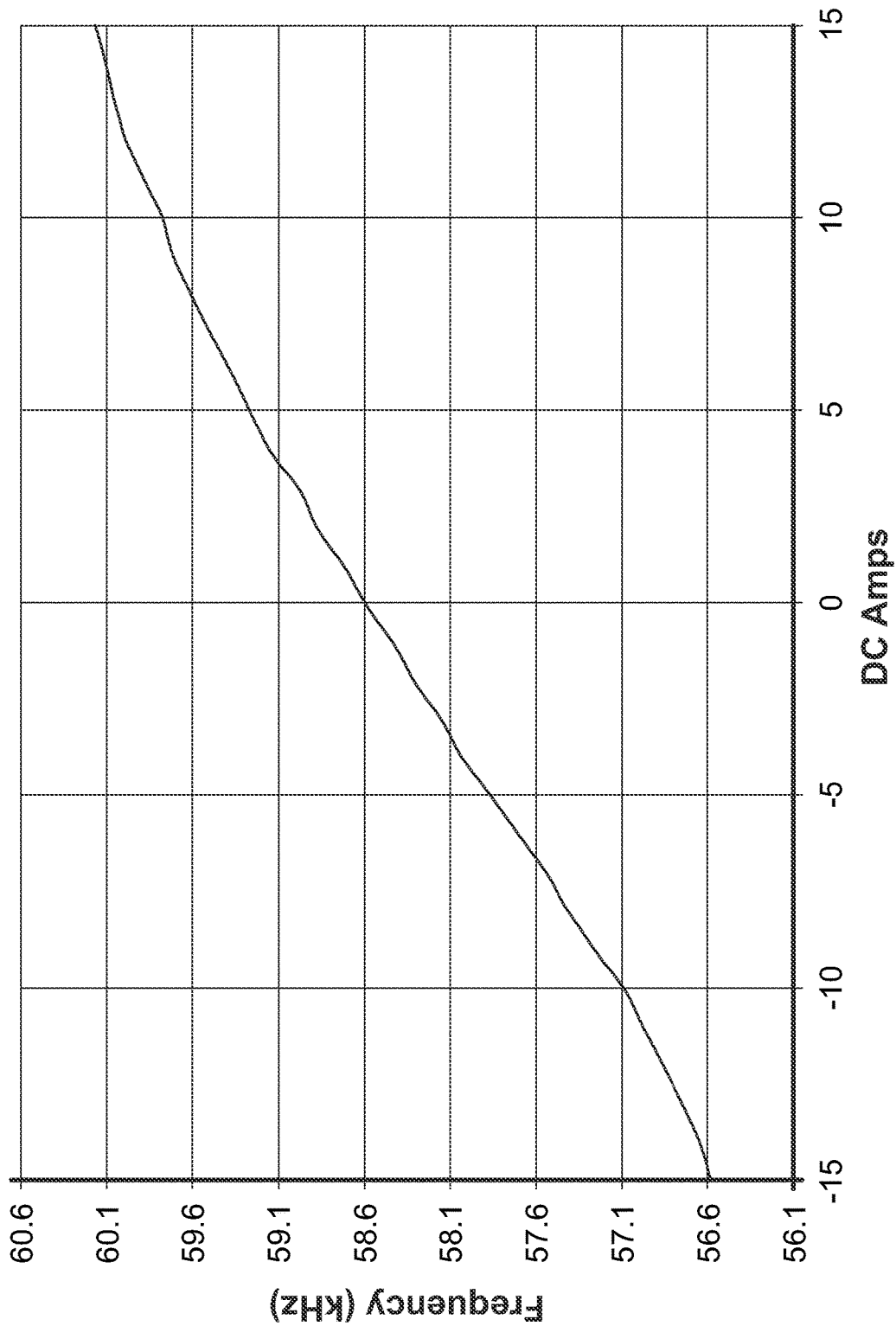
FIG. 11B shows magnetostrictive resonator sensor characterization for a sensor assembly according to the present disclosure.

In another embodiment, a DC system may be monitored utilizing a sensor assembly 100 according to the present disclosure. In this embodiment, for example an electrical conductor 203 carrying current from a photovoltaic (PV) panel, may include a sensor assembly 100 mounted to provide the magnetostrictive resonator sensor 101 in sufficiently close proximity to the electrical conductor 203 to permit a magnetostriction effect between the electrical conductor 203 and the magnetostrictive resonator sensor 101. A first frequency profile is measured at a plurality of monitored frequencies and a second frequency profile at the plurality of monitored frequencies is measured and compared to the first frequency profile to provide current detection. FIG. 11A shows a coil output for the signal detector 103 of frequency vs. coil output in dB and FIG. 11B shows the magnetostrictive resonator sensor characterization for DC amps vs. frequency. The current detection results in amplitude and frequency shift and the frequency shifts semi-linearly until saturation.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for determining a state of an electrical conductor generating a magnetic field, the method comprising:
    providing a sensor assembly including a magnetostrictive resonator sensor and a signal detector;
    interrogating the electrical conductor by the sensor with a magnetic field impulse to obtain a first magnetic frequency profile;
    interrogating the electrical conductor by the sensor with a second magnetic field impulse to obtain a second frequency profile;
    transmitting the first frequency profile and the second frequency profile to a fault detector; and
    determining the state of the electrical conductor with the fault detector in response to the first frequency profile and the second frequency profile;
    wherein the sensor assembly is arranged and disposed to permit a magnetostriction effect between the magnetic field generated by the electrical conductor and the magnetostrictive resonator sensor.

2. The method of claim 1, further comprising interrogating the magnetostrictive resonator sensor with an interrogator at an interrogation frequency, wherein the first frequency profile and the second frequency profile from the magnetostrictive resonator sensor are in response to the interrogation frequency.

3. The method of claim 1, wherein the state is current in the electrical conductor.

4. The method of claim 1, wherein the state is a fault condition of an associated system.

5. The method of claim 4, wherein the fault conditions is selected from slow current leakage, an arc fault, instantaneous excessive harmonic composition, parasitic faults and combinations thereof.

6. The method of claim 1, wherein the first frequency profile is obtained with a signal detector.

7. The method of claim 1, wherein the first frequency profile includes a single frequency.

8. The method of claim 1, wherein the first frequency profile includes a plurality of frequencies.

9. The method of claim 1, wherein the state is determined utilizing a difference between the first frequency profile and the second frequency profile.

10. The method of claim 1, wherein the state is current and is calculated from one or both of the first frequency profile and the second frequency profile.

11. The method of claim 1, wherein the second frequency profile is an operational state frequency corresponding to operation.

12. A fault monitoring system comprising:
    a sensor assembly comprising:
        a magnetostrictive resonator sensor;
        a signal detector arranged and disposed to measure a frequency profile from the magnetostrictive resonator sensor; and
        wherein the sensor assembly is arranged and disposed to permit a magnetostriction effect between a current carrying conductor and the magnetostrictive resonator sensor before and after a magnetic field impulse interrogation by an interrogator that generates the magnetic field impulse;
    at least one processor;
    a non-transitory, computer-readable medium having instructions stored thereon that are executable by the at least one processor to cause the system to:
        obtain a first frequency profile and a second frequency profile from the sensor assembly when interrogated by a magnetic field impulse by an interrogator; and
        determining the state of one or both of the electrical conductor or the associated system from the first frequency profile and the second frequency profile.

13. The system of claim 12, further comprising an interrogator arranged and disposed to interrogate the magnetostrictive resonator sensor at an interrogation frequency.

14. The system of claim 12, further comprising a fault detector in electrical communication from the sensor assembly, the fault detector being configured to receive the frequency profile from the magnetostrictive resonator sensor.

15. The system of claim 14, wherein the fault detector determines a state of one or both of an electrical conductor or an associated system.

16. The system of claim 14, wherein the state is determined utilizing a difference between the first frequency profile and the second frequency profile.

17. The system of claim 14, wherein the state is current and is calculated from one or both of the first frequency profile and the second frequency profile.

18. A system for determining a state of an electrical conductor carrying an electrical current or an associated system, comprising:
    a sensor assembly arranged and disposed to receive a magnetic frequency response from the electrical conductor;
    an interrogator that generates a magnetic field impulse;
    at least one processor;

a non-transitory, computer-readable medium having instructions stored thereon that are executable by the at least one processor to cause the system to:
obtain a first frequency profile and a second frequency profile from the sensor assembly when interrogated by the magnetic field impulse by the interrogator; and
transmitting the first frequency profile and the second frequency profile to a fault detector to determine the state of one or both of the electrical conductor or the associated system from the first frequency profile and the second frequency profile;
wherein the sensor assembly is arranged and disposed to permit a magnetorestriction effect between the magnetic field impulse and the sensor assembly.

19. The system of claim 18, wherein to obtain the first frequency profile and the second frequency a plurality of frequencies are monitored with the sensor assembly.

\* \* \* \* \*